United States Patent [19]

Joshi et al.

[11] Patent Number: 5,116,810
[45] Date of Patent: May 26, 1992

[54] PROCESS FOR MAKING ELECTRICAL CONNECTIONS TO HIGH TEMPERATURE SUPERCONDUCTORS USING A METALLIC PRECURSOR AND THE PRODUCT MADE THEREBY

[75] Inventors: Chandrashekhar H. Joshi; Christopher A. Craven, both of Bedford, Mass.

[73] Assignee: American Superconductor Corporation, Watertown, Mass.

[21] Appl. No.: 422,227

[22] Filed: Oct. 16, 1989

[51] Int. Cl.$^5$ .................. C01F 17/00; C22C 24/00
[52] U.S. Cl. .......................... 505/1; 427/62; 428/930; 505/702; 505/706; 505/725; 505/736; 505/739
[58] Field of Search ............ 505/1, 725, 736, 739, 505/702, 706; 427/62; 428/930

[56] References Cited

U.S. PATENT DOCUMENTS

| | | | |
|---|---|---|---|
| 4,826,808 | 5/1989 | Yurek et al. | 505/1 |
| 4,861,751 | 8/1989 | Tenhover | 505/1 |
| 4,879,270 | 11/1989 | Maxfield et al. | 505/1 |
| 4,885,273 | 12/1989 | Sugimoto et al. | 427/62 |
| 4,916,114 | 4/1990 | Hoenig | 505/1 |
| 4,962,085 | 10/1990 | deBarbadillo, II et al. | 505/1 |

FOREIGN PATENT DOCUMENTS

| | | | |
|---|---|---|---|
| 0305300 | 3/1989 | European Pat. Off. | 505/736 |
| 0292532 | 11/1988 | Japan | 505/736 |
| 0017318 | 1/1989 | Japan | 505/736 |
| 0035816 | 2/1989 | Japan | 505/740 |
| 0089112 | 4/1989 | Japan | 505/736 |
| 0089174 | 4/1989 | Japan | 505/1 |
| 0159983 | 6/1989 | Japan | 505/1 |
| 0164731 | 6/1989 | Japan | 505/739 |
| 1166418 | 6/1989 | Japan | 505/736 |

OTHER PUBLICATIONS

Yurek et al in MRS-Symp. Proc. vol. 99, ed. Brodsky et al, Dec. 1987, p. 619.
Pinkerton et al Appl. Phys. Letts. 53 (Aug. 1988) 438.
"EuBa$_2$Cu$_3$O$_x$ Produced by Oxidation of a Rapidly Solidified Precursor Alloy: An Alternative Preparation Method for High T$_c$ Cermanic Superconductors", by R. Haldar, Y. Z. Lu, and B. C. Giessen, Jun. 30, 1987, *Barnett Institute of Chemical Analysis and Materials Science*, Northeastern Univ., Boston, Massachusetts.

*Primary Examiner*—Upendra Roy
*Attorney, Agent, or Firm*—Hale and Dorr

[57] ABSTRACT

The invention relates to a process for making a superconducting connection between a pair of superconducting ceramic oxide pieces, each of the pieces having been formed by combining the metallic elements of the superconducting oxide in substantially the stoichiometric proportions needed to form the superconducting oxide into a precursor and forming the precursor into a shaped piece. The process comprises the steps of: contacting each of the shaped pieces with the other; connecting each of the shaped pieces to the other by means for forming a metallurgical bond between the shaped pieces; and oxidizing the connected shaped pieces under conditions sufficient to oxidize the metallic elements to the superconducting oxide.

In other embodiments of the invention, the process is for forming a superconducting connection between a pair of pieces having a superconducting ceramic oxide/noble metal composition; or for forming a joint between a superconducting ceramic oxide and a normal conductor.

26 Claims, 2 Drawing Sheets

PROCESS FOR MAKING ELECTRICAL CONNECTIONS TO HIGH TEMPERATURE SUPERCONDUCTORS USING A METALLIC PRECURSOR AND THE PRODUCT MADE THEREBY

BACKGROUND OF THE INVENTION

This invention relates generally to superconducting materials, and in particular, to a process for making electrical connections to and between such materials. Superconductors are materials having essentially zero resistance to the flow of electrons at temperatures below a certain critical temperature, $T_c$. The $T_c$ varies for each type of superconducting material.

It is known that certain metal oxide ceramics exhibit superconductivity at a relatively high temperature, i.e., at temperatures greater than 30° K. (0° K.= −273.15° C.). The recently discovered superconductors can be categorized into two groups: the first having the general formulae of $R_aM_bX_cO_y$; and the second having the general formula $(M_{1-x}Q_x)_aL_bCa_cCu_dO_y$. In the superconductors having the formula $R_aM_bX_cO_y$, the symbols R, M, and X represent elements of the periodic table and 0 represents oxygen. R can be one or a combination of Y, Yb, Er, Ho, Eu, Dy, Gd, La, Pr, Sm, Nd; M is one of Ba, Ce or Th; and X can be one of Cu, Bi, K or Ni. In these materials, the atomic ratios of the chemicals R:M:X, i.e., the subscripts a:b:c, are usually in the ratio of 1:2:3. Therefore, these superconductors are generally referred to as the "1-2-3" compounds. However, other formulations having the ratios of 2:4:7 and 1:2:4 have also been discovered.

In the formulations of the form $(M_{1-x}Q_x)_aL_bCa_cCu_dO_y$, the symbol M represents either Pb or Sb, the symbol N represents either Bi or Tl and the symbol L represents Sr or Ba. These superconductors have been found with ratios a:b:c:d of 2:2:n:n+1 where n=(0,1,2,3...).

All of these various metal oxides become superconductors at low temperatures. However, the most widely used compounds are $Y_aBa_bCu_cO_y$, $(Pb_{1-x}Bi_x)_aSr_bCa_cCu_dO_y$, and $(Pb_{1-x}Tl_x)_aBa_bCa_cCu_dO_y$, which have critical temperatures above the boiling temperature of liquid nitrogen at one atmosphere pressure, i.e., (77.3° K.).

It is useful to provide such superconducting oxides in a form suitable for conducting electricity, and particularly, in a form which can be electrically connected to other superconducting elements and non-superconducting (i.e., normal conducting) elements.

As is readily understood, it is vital to be able to join pieces of superconducting material to each other in a way that maintains superconductivity. It is also important to be able to join a piece of superconducting material to a piece of normal conductor in a way that does not adversely effect the superconductivity of the piece of superconducting material. Before the present invention, due to the chemical and mechanical properties of superconductors, it has been difficult to make suitable electrical joints and connections involving superconductors.

For most applications, these materials need to be formed into a wire like structure which in turn is used as a conductive path for electricity. For some applications, wire is wound into coils to generate a magnetic field. A continuous length of thousands of feet or even miles of conductor is needed and it must be superconducting along its entire length. The long lengths must be fabricated by joining two or more shorter lengths end to end. These joints between two lengths must have the same superconducting properties, i.e., critical current, as the wire itself for the joined wire to be useful in the given application.

Furthermore, it is necessary that a technique be available for removing and replacing a section of the wire if it becomes damaged. For example, if a power transmission line is damaged by lightning, the line breaks must be repaired by removing the damaged section of the line and replacing it with a new piece. If the line is made from superconducting wire, the connections between the new section and the undamaged sections of the original line must be superconducting and also have the same current capacity as the original and replacement wires themselves.

It is known how to make an electrically conducting joint between two pieces of a specific type of high temperature superconductor. The superconductor is $YBa_2Cu_3O_{7-x}$. This type of superconductor is a "1-2-3" superconductor. See generally Y. Tzeng, "Welding of $YBa_2Cu_3O_{7-x}$ Superconductor", *Journal of the Electrochemical Society*, Volume 136, Number 2, pp 582–583, (February 1989). According to the disclosed technique, two pieces of 1-2-3 superconductor are overlapped and heated to 1100° C., fusing the pieces together. Following the fusion, the material is heated again to form a 1-2-3 phase and is then oxygenated.

The known technique suffers from a number of disadvantages. The high temperature (1100° C.) required to fuse the ceramic pieces together destroys the 1-2-3 phase structure. Above 1015° C., 1-2-3 superconductors decompose upon melting into non-superconducting phases. For example, the $YBa_2Cu_3O_{7-x}$ melts into a 2-1-1 oxide, $Y_2BaCuO_5$, and $BaCuO_2 \cdot CuO$. The reformation to a 1-2-3 phase compound requires a long exposure at a temperature between 900° C. and 950° C., followed by oxygenation at 450° C. to 500° C. Thus, lengthy steps are required. It is also possible that the phase decomposition will have produced a phase situation that will not produce a superconductor at all upon subsequent heat treating.

An additional drawback to this known process is that it cannot be used for a composite of a superconducting ceramic and a noble metal, such as silver, palladium, platinum or gold. By "noble metal," it is meant a metal that will not oxidize at the temperatures applied during certain heat treating conditions discussed below, necessary to create a superconductor. Formation of such a metal/ceramic composite is disclosed in U.S. Pat. No. 4,826,808, to Yurek et al, "Preparation of Superconducting Oxides and Oxide Metal Composites," at examples 2–10. The 4,826,808 patent is hereby incorporated by reference herein.

The presence of the noble metal provides beneficial mechanical properties to the superconducting composite. The composite may be in many forms. The noble metal and ceramic may be in alternating sheets or layers. The noble metal can be present as islands within a matrix of ceramic or vice versa. The noble metal and ceramic can each be present as a continuous phase intimately intermixed within the other, much like a sponge and the voids there through. The known process cannot be used for noble metal/ceramic composites because noble metals may either melt at the high processing temperatures, or agglomerate as solid particles, thereby minimizing or eliminating the desired effects of the noble metal in the composite.

The Yurek patent also discloses generally a method for preparing a superconductor, of either an oxide or a metal/oxide composite. The metallic elements of the oxide in substantially the stoichiometric proportions needed to form the superconducting oxide or composite are combined to form an alloy. The alloy is shaped as desired (or applied to a substrate in some form of coating) and is then oxidized in a heating cycle. The resultant is a superconducting oxide or metal/oxide composite.

Thus, the several objects of the invention include: to provide a process of forming a superconducting joint that under some circumstances does not require long resident times at elevated temperatures; to provide a process of forming a superconducting joint that does not require elevating the composite to temperatures above the melting temperature of the superconducting oxide or of the noble metals such as silver or gold; to provide a process of forming a superconducting joint that uses well-known standard metal joining techniques; to provide a process of forming a superconducting joint that results in a joint that is relatively homogeneous, as compared to the major body of the superconducting material.

SUMMARY OF THE INVENTION

In a preferred embodiment the process of the invention is for forming a superconducting connection among a pair of superconducting ceramic oxide pieces, each of the pieces having been formed by combining the metallic elements of the superconducting oxide in substantially the stoichiometric proportions needed to form the superconducting oxide into a precursor and forming the precursor of combined metallic elements into a shaped piece. The process includes the steps of: placing each of the shaped pieces in a protected environment; contacting each of the shaped pieces with the other; connecting each of the shaped pieces to the other by means for forming a metallurgical bond between the shaped pieces; and oxidizing the connected shaped pieces under conditions sufficient to oxidize the metallic elements to said superconducting oxide.

Suitable metal joining techniques include but are not limited to: electron beam or laser welding, spot welding, flash butt welding and ultrasonic bonding. The welding takes place in a protected environment, which is provided by either a vacuum, or a shielding gas flowing over the joint region. After the pieces of metallic precursor have been joined, they can be oxidized by the process discussed in the Yurek et al U.S. Pat. No. 4,826,808 patent and form a continuous superconducting phase through the joint. The methods of soldering and brazing may also prove useful if the soldering or brazing materials are those which, upon heat treatment, become superconducting.

In a second preferred embodiment the product of the invention is a superconducting joint among a pair of superconducting pieces.

In a third preferred embodiment, the process of the invention is for forming a joint between a superconducting ceramic oxide and a normal conductor.

In a fourth preferred embodiment, the product of the invention is an electrically conducting joint between a normal conductor and a superconducting ceramic oxide.

In a fifth preferred embodiment, the product of the invention is a joint between a pair of metallic precursors of the type that become superconducting upon certain heat treatment and oxidation.

In a sixth preferred embodiment, the process of the invention is for forming a superconducting joint among a pair of superconducting ceramic oxide pieces, at least one of which has a composite ceramic/noble metal composition.

In a seventh preferred embodiment, the product of the invention is a superconducting joint among a pair of superconducting ceramic oxide pieces, at least one of which has a composite ceramic/noble metal composition.

DETAILED DESCRIPTION OF PREFERRED EMBODIMENTS OF THE INVENTION.

Figure 1A:
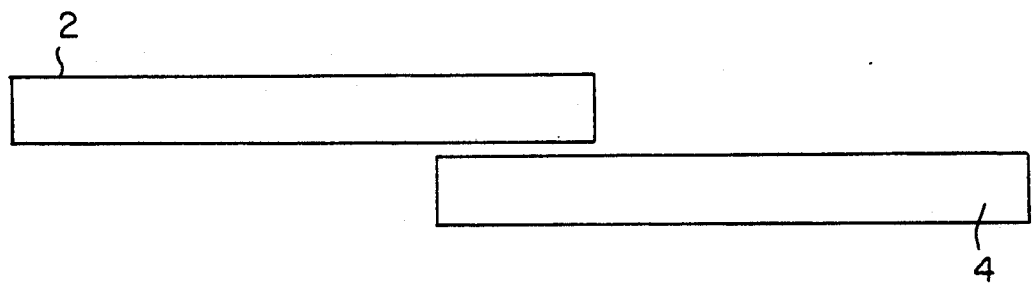
FIG. 1A is a schematic showing two lengths of metallic precursor to be joined according to the process of the invention.

The process of the present invention uses relatively well understood metal bonding techniques to join materials together before they are transformed into the high temperature superconductor. The process requires creating a metallic precursor of the superconductor to be formed, according to the process taught in Yurek, et al., U.S. Pat. No. 4,826,808, identified above. As used in this description, "precursor" means a metal which, when heat treated, will form an entirely ceramic superconductor, or one which will form a noble metal/ceramic superconducting composite, as discussed above. According to one method of providing the metallic precursor, the metallic precursor elements are melted under vacuum in an induction melting furnace in proportions appropriate to provide the stoichiometric combination required for the superconductor. The liquid precursor is heated to approximately 800° C. and is then shaped into a piece, e.g., by melt spinning into a solid alloy ribbon. The shaped precursor, is formed to the desired shape for the electrically conducting end product. As shown in FIG. 1A, a number of shaped pieces 2, 4 are brought into contact in the configuration ultimately desired. The contact takes place in a protected environment, which may be provided by either a vacuum, a shielding gas flowing over the joint region, such as helium, argon and other inert gases or a glove box enclosing such an inert gas. The protected environment is not always necessary if a noble metal/ ceramic composite is used.

Figure 1B:
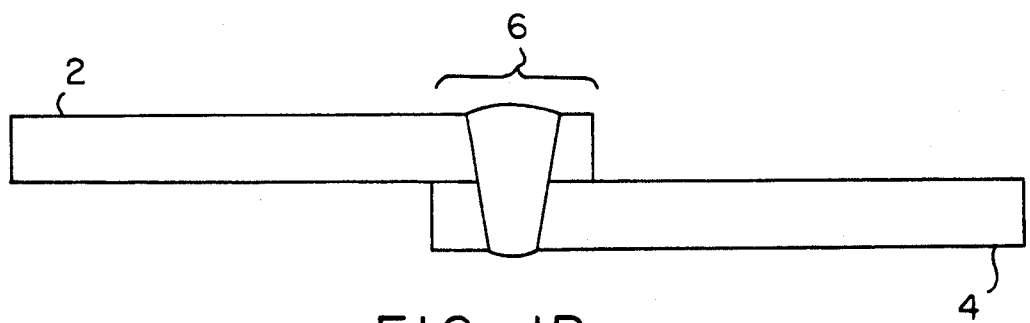
FIG. 1B is a schematic showing an autogenous weld made between the lengths of precursor by conventional welding techniques.
Figure 1C:
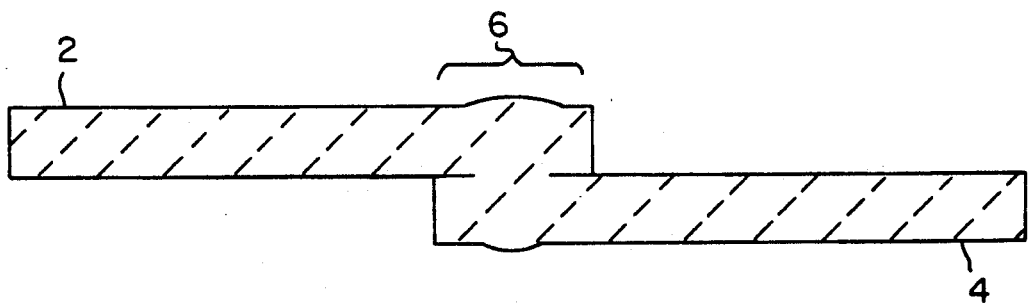
FIG. 1C is a schematic showing the joint of the invention, i.e., the welded metallic precursor shown in FIG. 1B, heat treated and oxidized to convert the weld zone into a uniform superconducting oxide.

The pieces are welded together, to form a weld zone 6 joining pieces 2 and 4, as shown in FIG. 1B. After heat treating, as shown in FIG. 1C, the precursor in both the bulk metal of the original pieces 2 and 4 and the weld zone 6 are converted into a uniform superconducting oxide. If the precursor contains a noble metal, as defined above, then the weld zone 6 and the original pieces 2 and 4 are converted into a uniform superconducting oxide/ noble metal composite.

The invention will be described in more detail with reference to the following examples.

EXAMPLE 1

While in a protective environment, the various metallic precursor pieces were joined using a spot welder. For a precursor of Y-Ba-Cu-Ag having dimensions of 2 mm wide and 0.1 mm thick, a Raytheon Weldpower spot welder was used with a power setting of 1kVA for a duration of 0.25 sec. Once the precursor pieces were joined, the assembly was oxidized in a pure oxygen environment at 500° C. Thereafter, the temperature was raised to 900° C. and held until there was no more weight gain. The temperature was then lowered to 500° C. and maintained for eighteen hours. The temperature was then reduced to room temperature.

Photomicrographs of the joint region have shown its microstructure to be the same as that of the bulk material away from the joint. FIG. 1C schematically illustrates a photomicrograph of a cross-sectional view through a $YBa_2Cu_3O_7$/Ag composite joint made from melt spun ribbon, which was spot welded and subsequently oxidized.

EXAMPLE 2

The same procedure described in Example 1 was followed except that a precursor of Yb-Ba-Cu was used.

The resultant was a joined piece of superconducting oxide $YbBa_2Cu_3O_7$ where the joined region was again shown to have a microstructure the same as that of the bulk material away from the joint.

EXAMPLE 3

The same procedure for joining described in Example 1 is followed, except that ultrasonic bonding rather than spot welding is used to join the precursor. The joined precursor is oxidized as described in Example 1.

EXAMPLE 4

The same procedure for joining described in Example 1 is followed, except that ultrasonic bonding rather than spot welding is used to join the precursor. The joined precursor is oxidized as described in Example 1.

EXAMPLE 5

The same procedure for joining described in Example 1 is followed, except that electron beam welding rather than spot welding is used to join the precursor. The joined precursor is oxidized as described in Example 1.

EXAMPLE 6

The same procedure for joining described in Example 1 is followed, except that laser beam welding rather than spot welding is used to join the precursor. The joined precursor is oxidized as described in Example 1.

EXAMPLE 7

The same procedure for joining described in Example 1 is followed, except that gas tungsten arc (GTA) welding rather than spot welding is used to join the precursor. The joined precursor is oxidized as described in Example 1.

EXAMPLE 8

The same procedure for joining described in Example 1 is followed, except that flash butt welding rather than spot welding is used to join the precursor. The joined precursor is oxidized as described in Example 1.

EXAMPLE 9

The same procedure for joining described in any of the previously mentioned examples is followed for a Bi-(Pb)-Sr-Ca-Cu-(noble metal) alloy rather than a Y-Ba-Cu alloy. The joined precursor is given an oxidation treatment suitable for producing a superconductor.

EXAMPLE 10

The same procedure for joining described in any of the previously mentioned examples is followed for a Ti-Ca-Cu-(noble metal) alloy rather than a Y-Ba-Cu alloy. The joined precursor is given an oxidation treatment suitable for producing a superconductor.

The same procedure for joining described in any of the previously mentioned examples could be followed for the metal precursor alloy of any other ceramic superconductor system rather than a Y-Ba-Cu alloy. The joined precursor is given an oxidation treatment suitable for producing a superconductor.

It is also often necessary to electrically join a superconductor to a non-superconductor, for instance to connect a power source or other conventional equipment to the superconducting components. It has been known to deposit a thin film of metal onto a piece of superconducting oxide and then to solder the non-superconducting piece to the film/oxide.

The process of the invention can be used to join a superconductor to a non-superconductor. A piece of metallic precursor (either with or without incorporated noble metal) is joined by an appropriate technique, as discussed above, to a piece of non-superconducting metal. The non-superconducting metal must be one which is noble, or oxidizes only very slowly under the heat treating conditions which transform the precursor into the superconductor.

EXAMPLE 11

Using a Black and Webster capacitor discharge spot welder with a power setting of 300V, pieces of Yb-Ba-Cu alloy of dimensions 2 mm wide and 0.1 mm thick were welded to pieces of 0.5 mm thick fine silver foil. The joined materials were then oxidized in a pure oxygen environment at 500° C. Thereafter, the temperature was raised to 900° C. and held until there was no more weight gain. The temperature was then lowered to 500° C. and maintained for eighteen hours. The temperature was then reduced to room temperature. After this oxidation treatment, the silver remained in intimate electrical contact with the $YbBa_2Cu_3O_7$ superconductor.

Figure 2B:
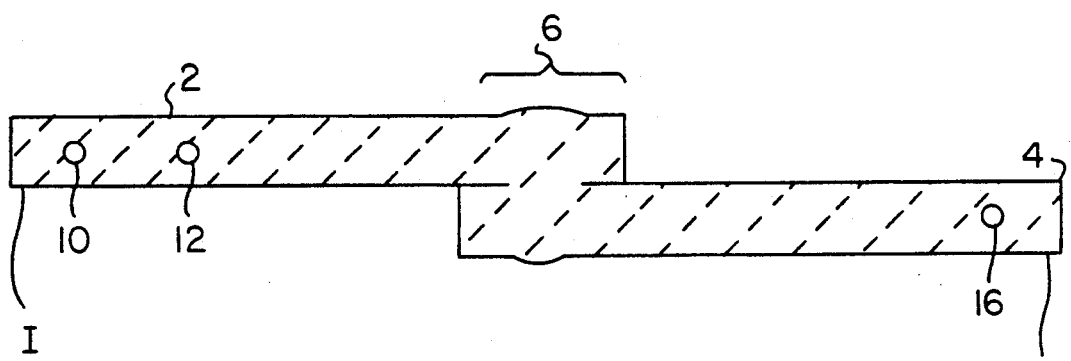
FIG. 2B is a schematic showing the set up for measuring the voltage and current represented in FIG. 2A.
Figure 2A:
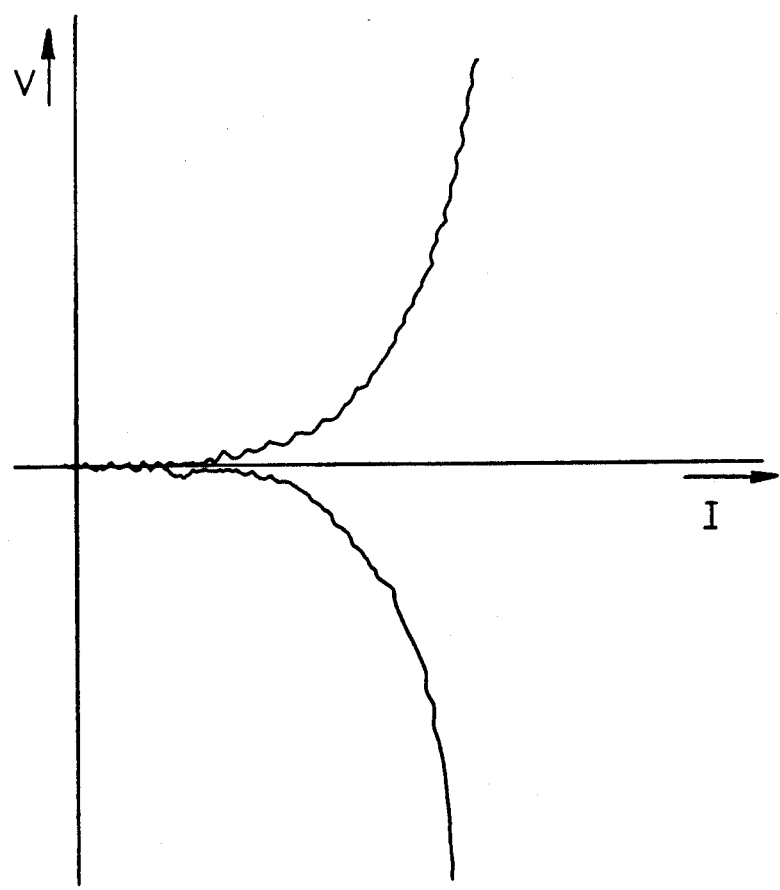
FIG. 2A is a graphical representation showing the relationship between voltage across and current through a unitary superconductor on the one hand and a superconductor complex joined according to the process of the invention on the other hand.

Critical current studies of joints made according to the process of the invention, for instance by spot welding two pieces of ribbon together, show that the homogeneity of the weld is comparable to the homogeneity of the individual component itself. A critical current ($I_c$) is the maximum current that may pass through a superconductor before the superconductor loses its superconducting capacity. As shown in FIG. 2A, two curves trace the voltage between two points on either side of the weld (upper curve, identified as W), as compared to the voltage between two points on the same side as the weld (lower curve, identified as N). FIG. 2B shows schematically the setup used to produce the curves. The curve W shows the voltage between points 10 and 16 and the curve N shows the voltage between points 10 and 12. Current is applied to the superconductors through the terminals designated I and is plotted along the horizontal axis. As can be seen, the trace of voltage remains constant for small values of current, and, for current above the critical current, increase markedly as the current increases. This is so for both the upper trace (across the weld) and the lower trace (across non-welded material). The increase in voltage implies an increase in resistance, and thus a loss in superconductivity after the critical current, $I_c$, has been reached. The traces are essentially mirror images of each other, thus indicating that the presence of the weld according to the process of the invention did not alter the superconducting capacity of the welded material, as compared to the homogeneous, unwelded material.

The process of the invention can be applied to any shape into which the precursor can be formed. For instance, ribbons or sheets of precursor can be rolled into a cylindrical shape and welded together. When oxidized, the cylinder forms a continuous cylindrical sheet of superconductor, which can be used as an electromagnetic shield.

The foregoing discussion should be taken as illustrative and not limiting in any sense. The precursor can be formed according to any suitable process that results in the metallic, unoxidized precursor. The precursors can be joined to each other according to any suitable metal joining technique which produces a metallurgical bond. The type of superconducting ceramic joints that can be made according to the process of the invention are not limited to those discussed in detail, and include those discussed in the Background section above.

Having described the invention, what is claimed is:

1. A process for forming a superconducting connection between a pair of superconducting ceramic oxide pieces, each of said pair formed by combining the metallic elements of said superconducting oxide in substantially the stoichiometric proportions needed to form said superconducting oxide into a precursor and forming said precursor into a shaped piece, said process comprising the steps of:
   a. placing each of said shaped pieces in a protected environment;
   b. contacting each of said shaped pieces with the other;
   c. connecting each of said shaped pieces to the other by means for forming a metallurgical bond between the shaped pieces; and
   d. oxidizing said connected shaped pieces under conditions sufficient to oxidize said metallic elements to said superconducting oxide.

2. The process of claim 1, said means for forming a metallurgical bond comprising spot welding.

3. The process of claim 1, said means for forming a metallurgical bond comprising laser welding.

4. The process of claim 1, said means for forming a metallurgical bond comprising ultrasonic bonding.

5. The process of claim 1, said means for forming a metallurgical bond comprising flash butt welding.

6. The process of claim 1, said superconducting pieces comprising an oxide of a general formula $R_aM_bX_cO_y$, where R is chosen from the group Y, Yb, Er, Ho, Eu, Dy, Gd, La, Pr, Sm and Nd.

7. The process of claim 1, said superconducting oxide comprising a general formula $(M_{1-x}Q_x)_aL_bCa_cCu_dO_y$, where M is chosen from the group Pb and Sb.

8. The process of claim 1 wherein said metallic elements comprise Pb, Bi, Sr, Ca, and Cu.

9. The process of claim 1 wherein said metallic elements comprise Pb, Tl, Ba, Ca and Cu.

10. The process of claim 1 wherein said metallic elements comprise Y, Ba, and Cu.

11. The process of claim 2 wherein at least one of said shaped pieces comprises a wire.

12. The process of claim 2 wherein at least one of said shaped pieces comprises a ribbon.

13. The process of claim 2 wherein at least one of said shaped pieces comprises a sheet.

14. The process of claim 2 wherein at least one of said shaped pieces comprises a bar.

15. The process of claim 2 wherein at least one of said shaped pieces comprises a tube.

16. The process of claim 6, where M is chosen from the group Ba, Ce and Th.

17. The process of claim 6, where X is chosen from the group Cu, Bi, K, Ni.

18. The process of claim 6, where a, b and c are in the ratio 1:2:3 respectively.

19. The process of claim 6, where a, b and c are in the ratio 2:4:7 respectively.

20. The process of claim 6, where a, b and c are in the ratio 1:2:4 respectively.

21. The process of claim 7 where Q is chosen from the group Bi and Ti.

22. The process of claim 7 where a, b, c and d are in the ratios 2:2:n:n+1, where n is chosen from the group zero and all positive integers.

23. The process of claim 21 where L is chosen from the group Sr and Ba.

24. A process for preparing a superconducting connection between a pair of pieces made up of a composite of a superconducting ceramic oxide phase and a noble metal phase, each of said pieces formed by combining the metallic elements of said superconducting oxide in substantially the stoichiometric proportions needed to form said superconducting oxide with said noble metal to form an alloy and forming said combined alloy into a shaped piece, said process comprising the steps of:
   a. contacting each of said shaped pieces with the other;
   b. connecting each of said shaped pieces to the other by means of forming a metallurgical bond between the shaped pieces; and
   c. oxidizing said connected shaped pieces under conditions sufficient to oxidize said metallic elements to said superconducting oxide without oxidizing said noble metal to form said composite.

25. The process of claim 24, further comprising the step of placing each of said shaped pieces in a protected environment before said contacting step.

26. The process of claim 24 wherein said noble metal is selected from the group consisting of silver, platinum, palladium and gold.

* * * * *